United States Patent [19]
Liang et al.

[11] Patent Number: 5,550,515
[45] Date of Patent: Aug. 27, 1996

[54] MULTIPHASE CLOCK SYNTHESIZER HAVING A PLURALITY OF PHASE SHIFTED INPUTS TO A PLURALITY OF PHASE COMPARATORS IN A PHASE LOCKED LOOP

[75] Inventors: Jui Liang, Laguna Niguel; Ramon Co, Trabuco Canyon; Ann Gui, Sunnyvale, all of Calif.

[73] Assignee: Opti, Inc., Milpitas, Calif.

[21] Appl. No.: 378,798

[22] Filed: Jan. 27, 1995

[51] Int. Cl.$^6$ ............... H03L 7/07; H03L 7/087; H03L 7/18
[52] U.S. Cl. ............... 331/11; 331/1 A; 331/16; 331/17; 331/18; 331/25; 327/107; 327/156
[58] Field of Search ............... 331/10, 11, 12, 331/16, 17, 18, 25, 1 A; 327/105, 107, 147, 148, 156, 157; 360/51; 370/120; 455/260

[56] References Cited

U.S. PATENT DOCUMENTS

| | | | |
|---|---|---|---|
| 3,571,743 | 3/1971 | Menkes | 331/11 |
| 4,888,564 | 12/1989 | Ishigaki | 331/1 A |
| 5,315,269 | 5/1994 | Fujii | 331/11 X |

*Primary Examiner*—David Mis
*Attorney, Agent, or Firm*—Fliesler Dubb Meyer & Lovejoy LLP

[57] ABSTRACT

A phase-locked loop wherein the output signal is effectively sampled at an increased rate from conventional phase-locked loops, allowing for a greater increase in the ratio of the output frequency to the input frequency while reducing the possibility of jitter or failure to lock. Multiple differently phased reference signals and correspondingly phased feedback signals are produced. The comparison of the feedback signals and the reference signals produce multiple error signals which are combined to adjust the oscillation frequency of the voltage-controlled oscillator.

26 Claims, 10 Drawing Sheets

MULTIPHASE CLOCK SYNTHESIZER HAVING A PLURALITY OF PHASE SHIFTED INPUTS TO A PLURALITY OF PHASE COMPARATORS IN A PHASE LOCKED LOOP

BACKGROUND

1. Field of the Invention

The invention relates to phase-locked loop ("PLL"), and more particularly to phase-locked loops well suite for use as clock synthesizers.

2. Background of the Invention

Frequency synthesizers are widely used as frequency multipliers wherein one or more output signals are generated from a single input signal. The input signal oscillates at one frequency, while the output signals oscillate at some number N times the input signal frequency. Frequency synthesizers are used in numerous applications, including, but not limited to clock generation and clock distribution in personal computer systems. These frequency synthesizers (or, as they are sometimes called, clock generators or synthesizers) are often used in an environment with a poorly regulated power supply. Often, the negative impact on the performance of a frequency synthesizer caused by the power supply is further aggravated by the effects of certain switching logic circuits.

An example of a conventional PLL is shown in FIG. 1. The input signal 1 (referred to herein as a "predecessor signal") enters the PLL 2 and is optionally modified by a frequency divider 3 to produce an "input signal" 11. In the prior art circuit, the input signal can also be referred to as a "reference signal". The reference signal is then compared in a phase detector 4 with the output signal 9 as modified by a second frequency divider 8. The relative difference in phase or "phase error" between these two signals is represented by a frequency adjustment signal on the output of the phase detector 4. The output of the phase detector is provided to a charge pump 5 and is then filtered in a low-pass filter 6 to eliminate the unwanted higher frequency components of the signal produced by the phase detector 4. The resulting output frequency control signal controls a voltage-controlled oscillator ("VCO") 7 which produces the output signal 9. The output signal 9 has a frequency $f_{out}$ which is proportional to the voltage of the signal produced by the low-pass filter 6. As described above, the output signal 9 is fed back to the phase detector 4 via a frequency divider 8.

An important effect of modifying the output frequency in response to the phase error is that the output signal, while having a frequency that is a multiple of the frequency of the input signal, can remain at a constant phase shift from the input signal. The output signal of a properly functioning PLL is thus "locked" on the input signal and the loop is said to be phase locked.

The output frequency produced by a PLL is related to the input signal frequency by the formula $$f_{out} = N/D \times f_{pr}$$

where N is the factor by which the output frequency is divided in the frequency divider 8 and D is the factor by which the input frequency is divided in the frequency divider 3. When the loop is phase-locked, the phase detector operates at a frequency equal to $f_{out}/N$ which is also equal to $f_{pr}/D$.

In many frequency synthesizers, the divisor N can be a large number. But because the output signal frequency is divided by N before being provided to the phase detector, the output signal frequency can only be sampled every N cycles of the output signal. Thus the generation of the phase error signal by the phase detector 4, and the adjustment of the output signal, can only occur every N cycles of the output signal (or equivalently, only once for each (relatively long) cycle of the input signal). The VCO is essentially operating "open loop" in-between the correction events. If N is sufficiently large and the input signal has a certain level of noise, the output signal may unacceptably "drift" and unlock from the input signal. In some cases the output signal may fail to lock onto the input signal at all.

The PLL may also produce what is known as "jitter" (limited but persistent back-and-forth variations in the output signal frequency). Any disturbance, noise from the power supply, for example, interferes with the VCO and may cause excessive jitter. A noise transient cannot be corrected until the next correction cycle which can be as far as N output cycles away.

SUMMARY OF THE INVENTION

It is therefore an object of the present invention to ameliorate some or all of the above problems.

It is another object of the present invention to provide a PLL which is reliable even at high values of N.

Roughly described, the above objects and others are accomplished according to the invention by providing phase correction opportunities more often than once for each cycle of the input signal.

In an embodiment, the improved PLL or frequency synthesizer has multiple phase detectors which make phase comparisons with multiple versions of the input signal, each delayed by a different delay time. Preferably the delayed input signals (referred to herein as "reference signals") together divide each cycle of the input signal into phase intervals which all have equal duration. That is, if there are M phase detectors numbered 0 through (M−1), each i'th one of the reference signals (i=1, . . . , M−1) is delayed, relative a 0'th one of the reference signals, by (i/M) times the period of the input signal. (The delay of the 0'th reference signal can be arbitrary because all other reference signal delays are specified only relative to the 0'th reference signal.) The feedback signals are also provided to the phase detectors in multiple versions, each delayed in a manner similar to the reference signals.

The present invention thus provides a mechanism for increasing the sampling frequency of the PLL relative to the input signal frequency, without reducing N.

In one embodiment, the input signal is processed by a preliminary PLL which produces the multiple reference signals. The frequencies of these reference signals are equal, they are locked on the input signal, and each i'th one of the reference signals is (i/M) times 360° out-of-phase with a 0'th one of the reference signals, i=1, . . . , M−1. Each of these reference signals is compared in a respective phase detector to a corresponding one of a number of feedback signals.

The phase detectors each individually pump up or pump down an output frequency control signal, which controls the output frequency of a voltage-controlled oscillator (VCO). The VCO produces the output signal and can also be part of a feedback circuit which generates the multiple feedback signals for the phase detectors. The feedback signals each have a frequency of (1/N) times the frequency of the output signal, but are phased similarly to the phasing of the reference signals. In an embodiment, if there are M feedback signals, then each j'th one of the feedback signals is (j/M) times 360° out of phase with a 0'th one of the signals, j=1, . . . , M−1. The feedback circuit can accomplish this by delaying each j'th one of the feedback signals, relative to the 0'th feedback circuit, by (j/M) times N cycles of the output signal (j=1, . . . , M−1).

BRIEF DESCRIPTION OF THE DRAWINGS

These and other advantages and features of the present invention will become better understood upon consideration of the following detailed description of the invention and the accompanying drawings, in which like reference numerals designate like parts throughout the figures.

DETAILED DESCRIPTION OF THE DRAWINGS

I. SYSTEM OVERVIEW

Figure 1:
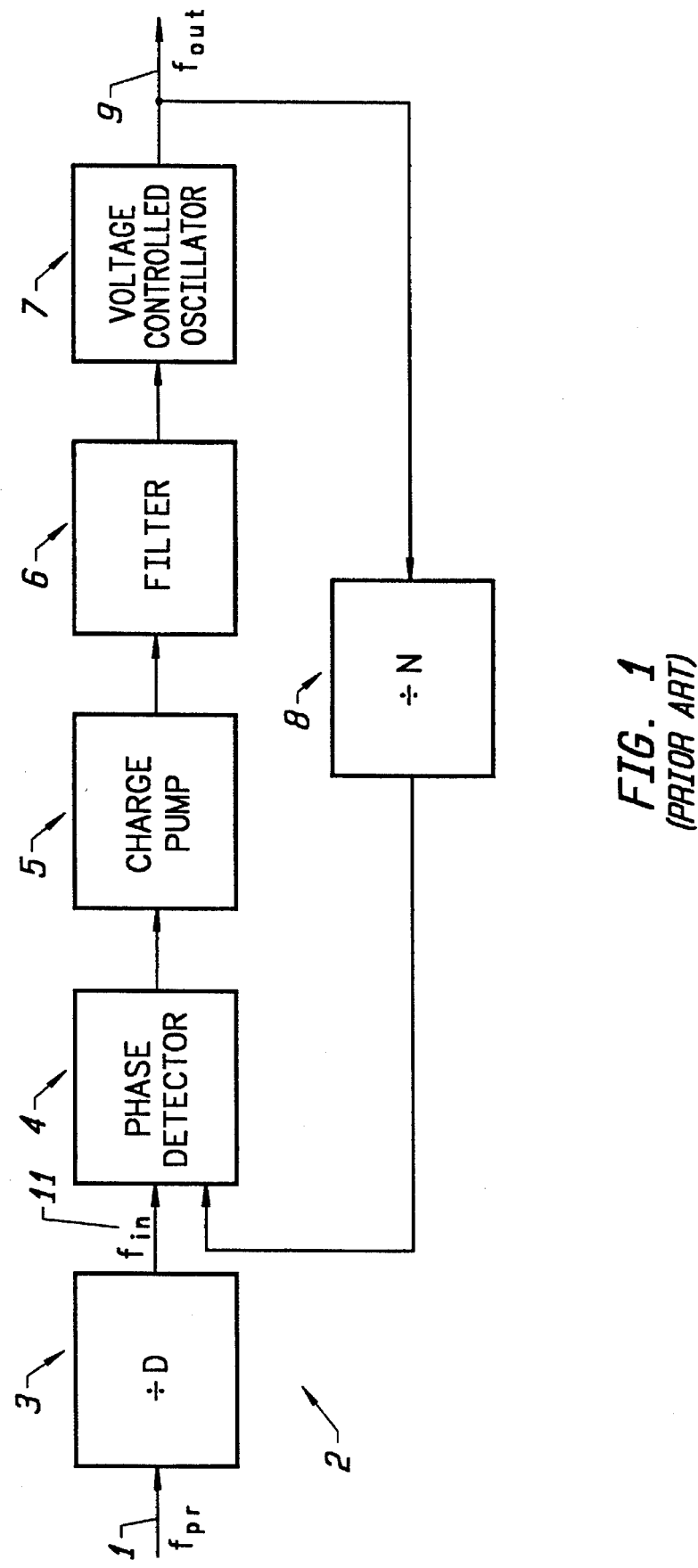
FIG. 1 shows conventional phase-locked loop.
Figure 2:
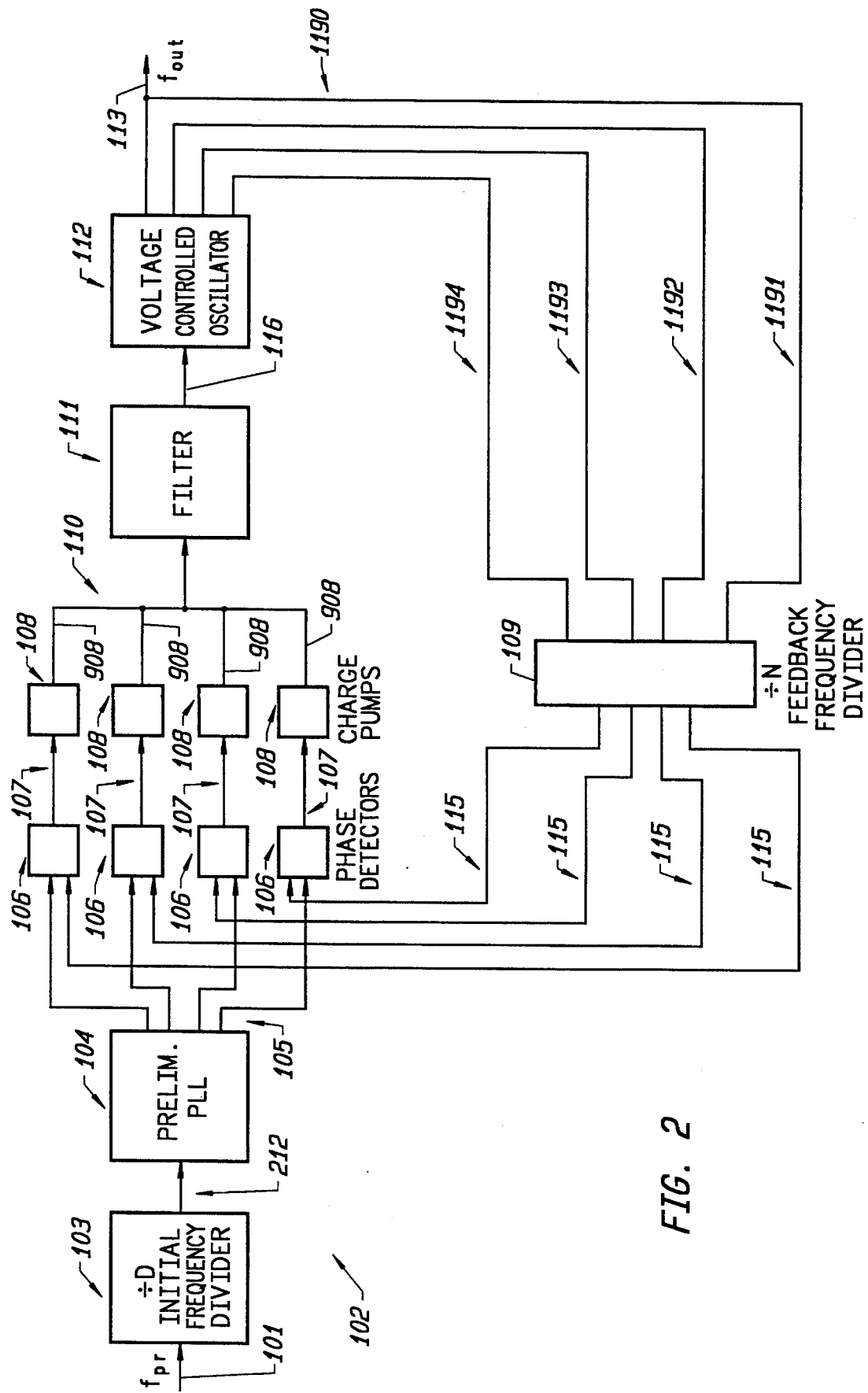
FIG. 2 shows a block diagram of an embodiment of an improved phase-locked loop according to the present invention.

FIG. 2 shows a block diagram of an embodiment of the improved PLL. This embodiment has four reference signals 105 and four feedback signals 115 (M=4). Those of ordinary skill in the art will appreciate that a different number of reference and feedback signals may be used.

A preliminary signal 101 with a specific frequency $f_{pr}$ and phase enters the improved PLL 102 and is optionally divided down in an initial frequency divider 103. It is well known that such an initial frequency divider can be inserted ahead of any PLL, and it is purely a matter of semantics as to whether the initial frequency divider is to be considered as part of, or ahead of, the PLL. If it is considered ahead of the PLL, then its output is considered the "input" to the PLL and the frequency division which it performs is not taken into account in calculating the output signal frequency relative to the "input" signal frequency. If it is considered part of the PLL, then its input signal is considered the input to the PLL and the frequency division which it performs is taken into account in calculating the output signal frequency relative to the "input" signal frequency.

The frequency divider 103 may be implemented by any number of techniques well-known to those of ordinary skill in the art. The output 212 of the frequency divider 103 is considered herein to be the PLL "input" clock signal with a frequency equal to the frequency of the predecessor signal 101 divided by D.

The output 212 of the frequency divider 103 is connected to the input of a preliminary PLL 104. The output of the preliminary PLL 104 is a set of four reference signals 105.

Each of the reference signals 105 produced by the preliminary PLL 104 has the same frequency, which is equal to the frequency of the input signal 212 of the preliminary PLL 104. If the reference signals are numbered 0 to 3, then each i'th one of the reference signals (i=1,2,3) is (i/4) times 360° out of phase with the 0'th reference signal. Thus, if one of the four multiple reference signals 105 is defined as having phase 0°, the other three reference signals will be out-of-phase with the first reference signal by 90°, 180° and 270°, respectively. Stated another way, each i'th reference signal (i=1,2,3) is a differently delayed version of the 0'th reference signal, with a delay interval of (i/M) times the period of one cycle of the 0'th reference signal.

The phase detectors 106 compare the phase of each of the reference signals 105 with a respective one of four feedback signals 115, producing four frequency adjustment signals 107. The magnitude and polarity of each of the adjustment signals is a function of the difference in phase between the reference signal and its corresponding feedback signal.

Each adjustment signal 107 is passed to a respective charge pump 108. The current outputs 908 of the charge pumps are all connected together and the resultant signal is filtered in a low-pass filter 111 to produce an output frequency control signal 116. The output frequency control signal 116 controls the VCO 112 which produces an output signal 113 and also four "intermediate" signals 1190. The output signal 113 and each of the intermediate signals 1190 are related in that they all have the same frequency $f_{out}$, which is a function of the voltage of the output frequency control signal 116. The output signal 113 is further related to the intermediate signals 1190 and further related to each other in that they are out-of-phase with each other by a set amount; specifically, in the described embodiment, each k'th intermediate signal (k=1, . . . , 3) is k times 90° out-of-phase with a 0'th one of the intermediate signals 1190.

All of the intermediate signals 1190 are passed to a feedback frequency divider 109, which uses them to produce the four feedback signals 115 previously described. The feedback frequency divider 109 is not strictly four parallel counters in the present embodiment, but is somewhat more involved as described in more detail below.

Thus, the output signal 113 is effectively sampled at a rate of (M/N) times the frequency of the output signal (as viewed from the feedback circuitry) or M times the frequency of the input signal (as viewed from the PLL input). These two formulations are equivalent when the PLL is locked. If a feedback signal 115 varies in phase from its corresponding reference signal 105, the resulting adjustment signal 107 will be reflected in the output charge pump output node 908 and in the filtered signal 116 which controls the VCO 112. The VCO 112 will thus adjust the frequency of the output signal 113 so that it ultimately locks onto the input signal 101.

II. IMPLEMENTATION OF FUNCTIONAL UNITS

The details of each of the function blocks of the improved PLL of FIG. 2 will now be discussed with reference to FIGS. 3 through 10.

A. Initial Frequency Divider

Figure 3:
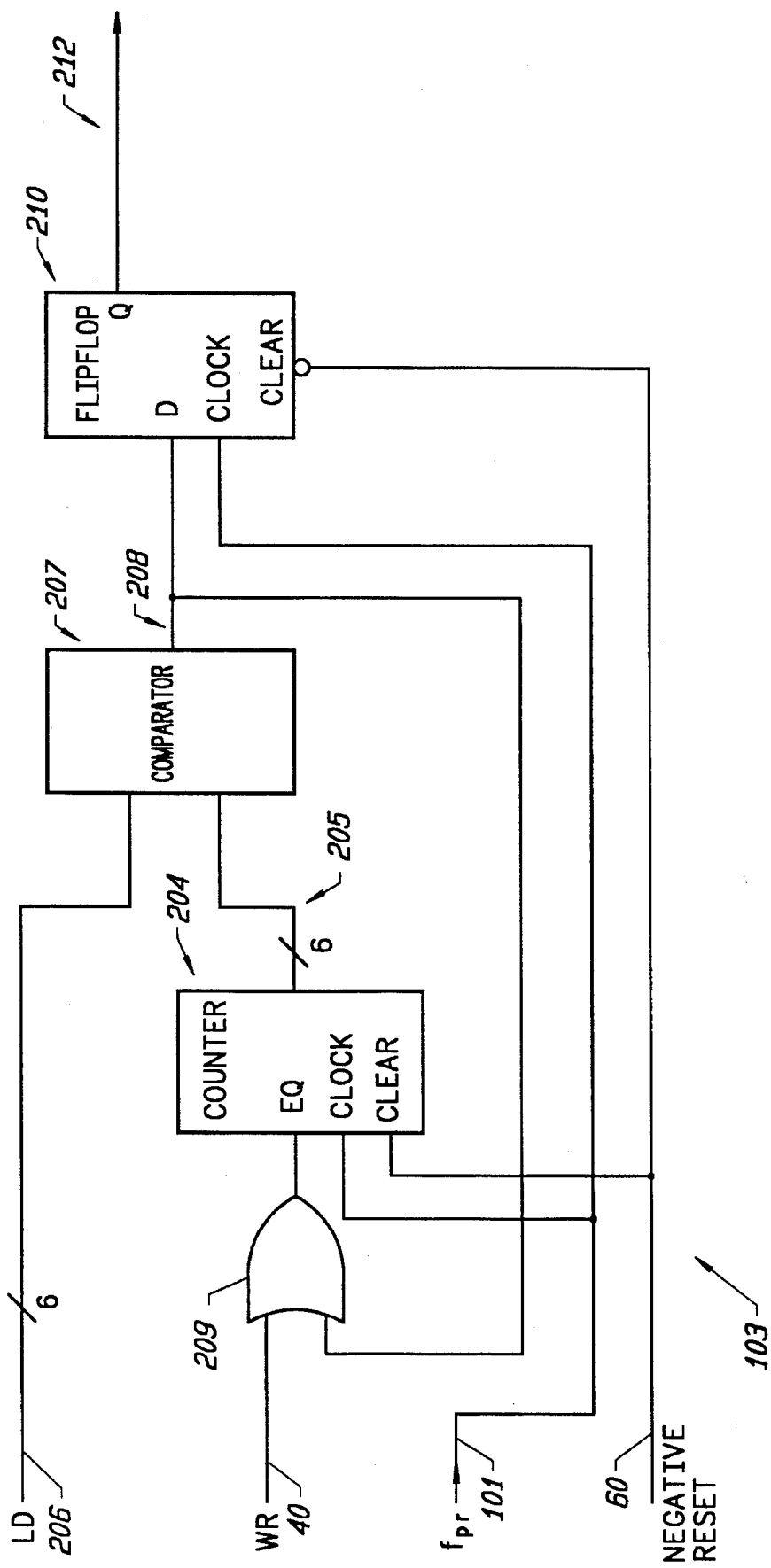
FIG. 3 details the initial frequency divider of FIG. 2.

An embodiment of the initial frequency divider 103 is shown in FIG. 3. The "predecessor" signal 101 is the clock input to a counter 204 which may be cleared and stopped by means of a pulse at its CLEAR input, or reset to zero while continuing the count, by means of a pulse at its EQ input. The output of the counter 204 is a six bit number 205 which is one of the inputs to a comparator 207. The other input to the comparator 207 is a six-bit number LD 206 which is programmable to provide the desired divisor D. When the output of the counter 205 is equal to the value on LD 206, the output of the comparator 208 goes high and is fed back to the EQ input of counter 204 via an OR gate 209. This sets the counter 204 output to 0 while continuing the count. The output of the comparator 208 is also passed to the D input of a D flip-flop 210 which is clocked by the predecessor signal 101. As a result, the output of D flip-flop 210 oscillates through one cycle every D cycles of the predecessor signal 101.

The output of the D flip-flop 210, which is the output of the frequency divider 103, is the "input" clock signal 212. The input clock signal thus has a frequency $f_{in}=f_{pr}/D$, where D is set by the input LD 206.

B. Preliminary Phase-Locked Loop

Figure 4:
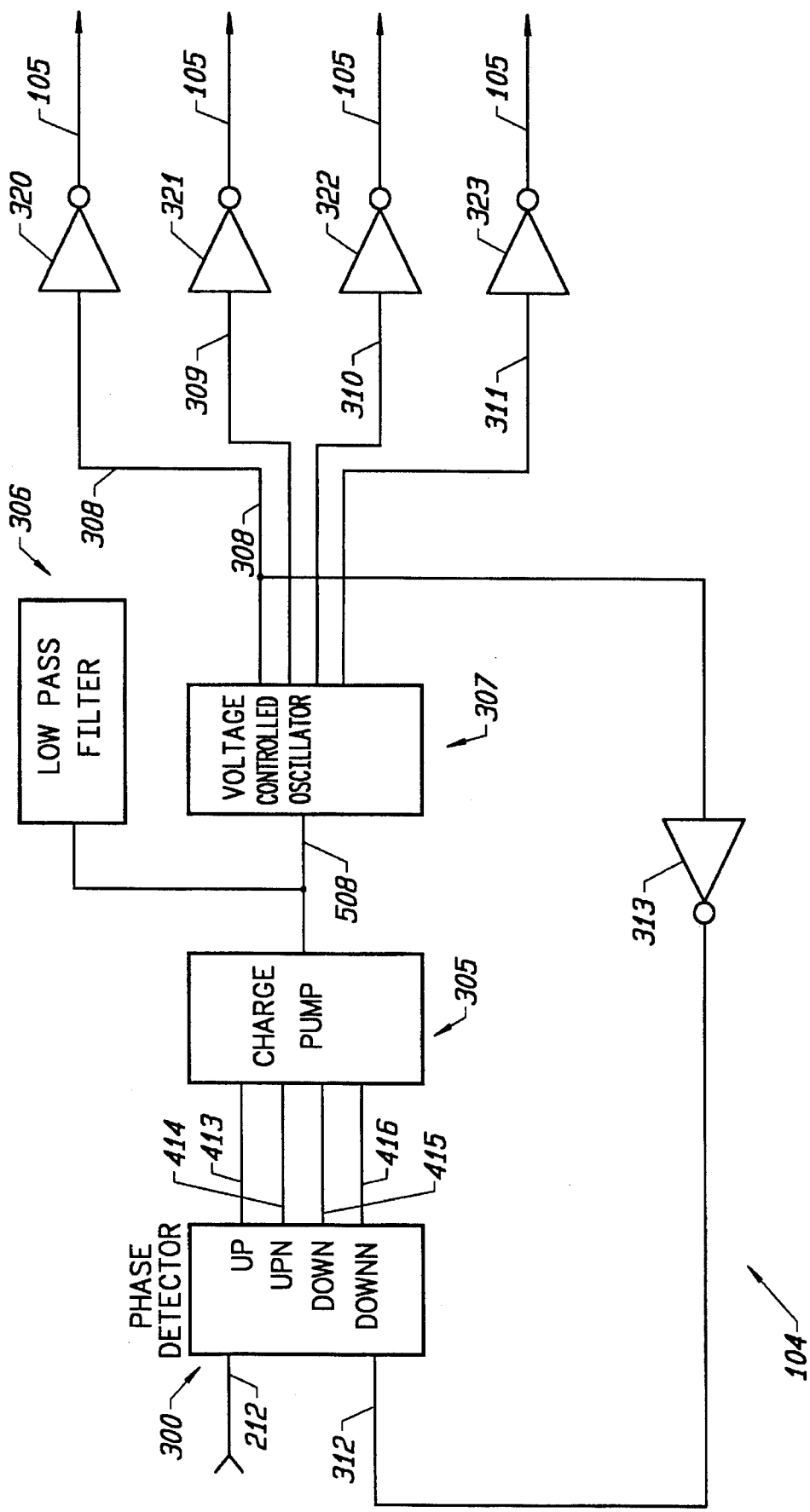
FIG. 4 is a block diagram of the preliminary phase-locked loop of FIG. 2.

The preliminary PLL 104 is illustrated in FIG. 4. It is basically a conventional phase-locked loop with a frequency multiplication factor of 1, except for some differences in the VCO. Referring to FIG. 4, the PLL 104 comprises a phase detector 300 which has an input coupled to receive the "input" signal 212, and a second input 312 coupled to receive a local feedback signal. The phase detector 300 produces differential pump-up signals UP and UPN and differential pump-down signals DOWN and DOWNN, and provides them to a charge pump 305. The charge pump 305 responds to the pump-up/down signals by adjusting its output voltage either up or down, by an amount related to the length of time that the pump-up signal or the pump-down signal is asserted. The output of charge pump 305 is filtered with a low-pass filter 306, the result being a control signal for a voltage-control oscillator 307.

Unlike many VCO's, the VCO 307 has four output lines 308, 309, 310 and 311. These outputs all oscillate at the same frequency (equal to the frequency of input signal 212 when the preliminary PLL 104 is locked), but they are phase shifted relative to each other by 0°, 90°, 180° and 270°. One of these outputs 308 is buffered by an inverting buffer 313 and fed back to the feedback input 312 of the phase detector 300 in a conventional manner. The outputs 308, 309, 310 and 311 of VCO 307 are each buffered by respective inverting buffers 320, 321, 322 and 323, to produce the four reference signals 105 (FIG. 2).

The preliminary PLL 104 will now be discussed in detail with reference to FIGS. 5 and 6.

1. Phase Detector

Figure 5:
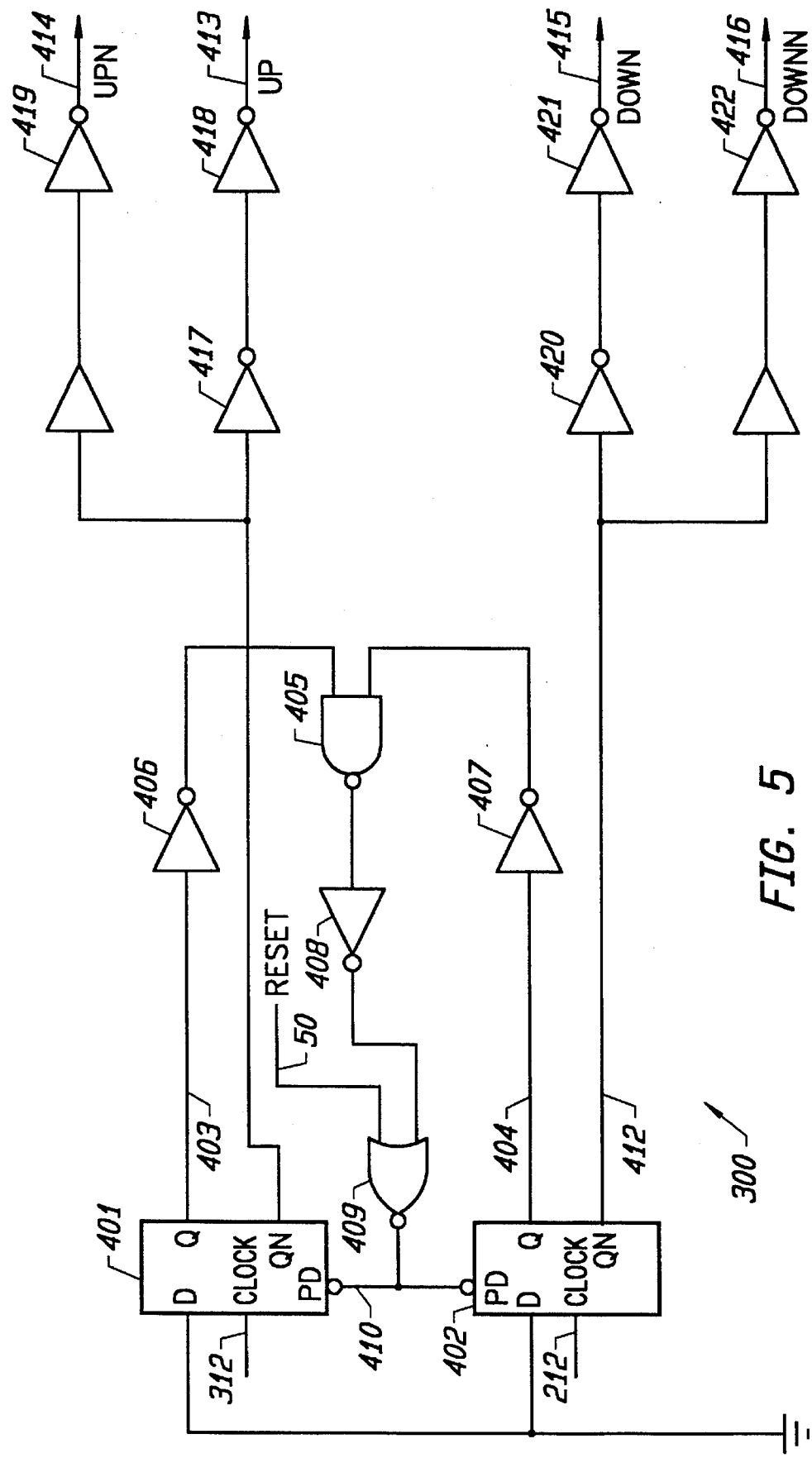
FIG. 5 shows the phase detector of FIG. 4.

FIG. 5 shows a detail of the phase detector 300 of FIG. 4. In FIG. 5, the "input" signal 212 enters the phase detector 300 as the clock signal to a D flip-flop 402. (All flip-flops in the present embodiment are rising-edge triggered unless noted otherwise.) The D input to the flip-flop 402 is permanently tied to ground. A second D flip-flop 401 is clocked by the feedback signal 312. The D input to the flip-flop 401 is also permanently tied to ground. Each of the D flip-flops 401, 402 has a positive output Q 403, 404 and a negative output QN 411, 412 and an inverting preset input PD. The Q outputs 403, 404 are inverted by respective invertors 406, 407 and are inputs to a NAND gate 405. The output of NAND gate 405 is inverted by an invertor 408 and is passed to a NOR gate 409. The other input of the NOR gate 409 is the reset 50 signal for the system. The output of the NOR gate 410 is connected to the inverting preset inputs of both of the D flip-flops 401, 402.

In operation, assume first that the flip-flops 401 and 402 have both been preset such that their Q outputs are high. In this situation, both inputs to NAND gate 405 will be low, resulting in a logic 1 at the output of NOR gate 409 (RESET is assumed to be in its inactive low state). Thus the inverting preset inputs for both of the flip-flops 401 and 402 are high (inactive). This is, therefore, a stable arrangement.

Assume now that the input signal on line 212 exhibits a rising edge transition and that this occurs prior to the next rising edge transition in the feedback signal 312. Since the flip-flop 402 is rising edge triggered, the rising edge in the input signal 212 causes the Q output of flip-flop 402 to go low, thereby bringing one input of NAND gate 405 high. The other input of NAND gate 405 remains low, however, so the preset inputs to the flip-flops 401 and 402 remain inactive (high). Then, when the next rising edge transition arrives in the feedback signal 312, the Q output of flip-flop 401 goes low. This brings the second input of NAND gate 405 high, which brings the output of NOR gate 409 low, thereby quickly presetting both flip-flops 401 and 402 such that their Q outputs are once again high. It can be seen that in this situation, where the rising edge in the input signal 212 preceded that in the feedback signal 312, the Q output of flip-flop 402 went low for a period of time equal to the phase difference between the two edges. The Q output of flip-flop 401 also went low when the rising edge arrived in feedback signal 312, but it then returned high almost immediately. The DOWN output of the phase detector 300 follows the QN output of flip-flop 402, so it can therefore be seen that in this situation, DOWN will be asserted for a length of time equal to the phase difference by which the input signal rising edge transition preceded the feedback signal rising edge transition. (Note that the terms UP and DOWN refer to the voltage level on the filter capacitor, not the frequency of operation of the VCO 307. The frequency output of the VCO 307 bears an inverse relationship to the voltage on the filter capacitor.)

By a similar analysis, it can be seen that if the feedback signal 312 rising edge transition precedes the input signal 212 rising edge transition, then the phase detector 300 will assert its UP output 413 for a length of time equal to the amount of time by which the rising edge transition in the feedback signal 312 preceded the rising edge transition in the input signal 212. In both cases, the complimentary signals DOWNN and UPN, respectively, are also asserted in order to provide the differential pair signals.

2. Charge Pump and Low-Pass Filter

The low-pass filter 306 is essentially merely a capacitor to ground, and the charge pump 305 operates in a conventional manner to source current into the capacitor during the time that UP is asserted and to sink current from the capacitor during the time that DOWN is asserted. Thus the voltage on the control input to the VCO 307 (FIG. 4) will be adjusted either up or down according to the phase difference, either positive or negative, of the feedback signal 312 relative to the input signal 212.

3. Voltage-Controlled Oscillator

The voltage-controlled oscillator 307 of the PLL 104 will now be described with respect to FIG. 6. The signal 508 is the control input to the VCO 307 from the charge pump 305 and low-pass filter 306.

VCO 307 comprises four sequentially connected differential amplifiers 704, 705, 706 and 707. The differential outputs of amplifier 707 are fed back to the differential inputs of amplifier 704, but in a crossed manner to effect a signal inversion. Thus, the amplifier sequence forms a ring oscillator. The amplifiers 704, 705, 706 and 707 each have a voltage-control input C, all of which are connected to receive the VCO 307 control signal 508. The voltage on the C input of each of the amplifiers controls the time delay with which the amplifier transmits an edge transition on its differential input to its differential output. Thus it can be seen that the frequency of oscillation of VCO 307 is controlled by the voltage on line 508. Note that the voltage on the C inputs is referenced to the positive supply voltage, not to ground; thus a higher control voltage on the C input results in a longer delay of each amplifier, and a slower output frequency.

Figure 6:
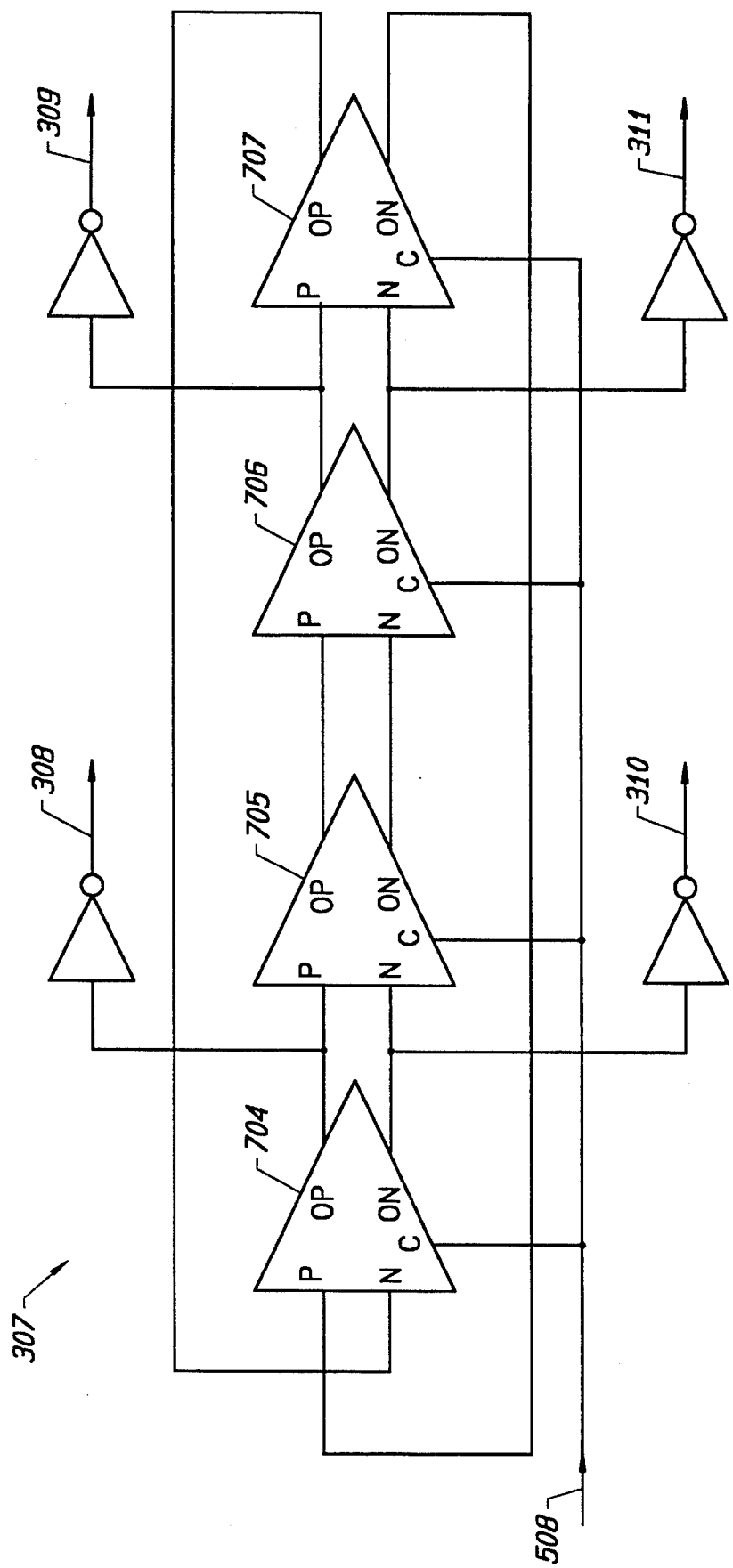
FIG. 6 shows the voltage-controlled oscillator of FIG. 4.

As is known, since a ring oscillator such as that in FIG. 6 really has no beginning and no end, the output signal can be taken from the output of any of the amplifiers. Furthermore, for an amplifier with a differential output, the two signals of the output pair are always 180° apart. Finally, for a four-amplifier ring, the signal at the output of one amplifier will be 90° out of phase with the signal at the output of the amplifier which is two amplifiers upstream (or downstream) in the ring. In the VCO of FIG. 6, the two conductors of the differential output of amplifier 704, and the two conductors of the differential output of amplifier 706, are each inverted by respective inverting buffers to produce the four output signals of the VCO 307. Thus it can be seen that if the reference signal 308 (which is derived from the non-inverting output of amplifier 704) is considered the 0'th reference signal, then the first, second and third reference signals are 309, 310 and 311, respectively. These signals lag the 0'th reference signal by 90°, 180° and 270°, respectively.

Although the ring oscillator in FIG. 6 uses four amplifiers, it will be appreciated that different numbers of amplifiers can be used to produce the four evenly-phased reference signals. Additionally, it will be appreciated that other numbers of amplifiers can be used, including an odd number of amplifiers, if it is desired to produce either more or less than four reference signals.

C. Phase Detectors, Charge Pumps and Filter

The phase detectors 106 are each identical to the phase detector 300 (FIG. 5) in the preliminary phase-locked loop 104, with the appropriate one of the reference signals 105 being provided to the clock input of the flip-flop 402 in FIG. 5, and with the corresponding one of the feedback signals 115 being provided to the clock input of flip-flop 401. Similarly, the charge pumps 108 are each identical to the charge pump 305 in FIG. 4, which is conventional.

The outputs 908 of all of the charge pumps 108 are all connected together and to the filter 111 which, like the filter 306 (FIG. 4) in the preliminary phase-locked loop 104, is merely a capacitor to ground. The node at which the four charge pump outputs 908 connect together is the top of the capacitor in filter 111. This node also constitutes the output frequency control signal 116 (FIG. 2) for the voltage-controlled oscillator 112.

D. Voltage-Controlled Oscillator

Figure 7:
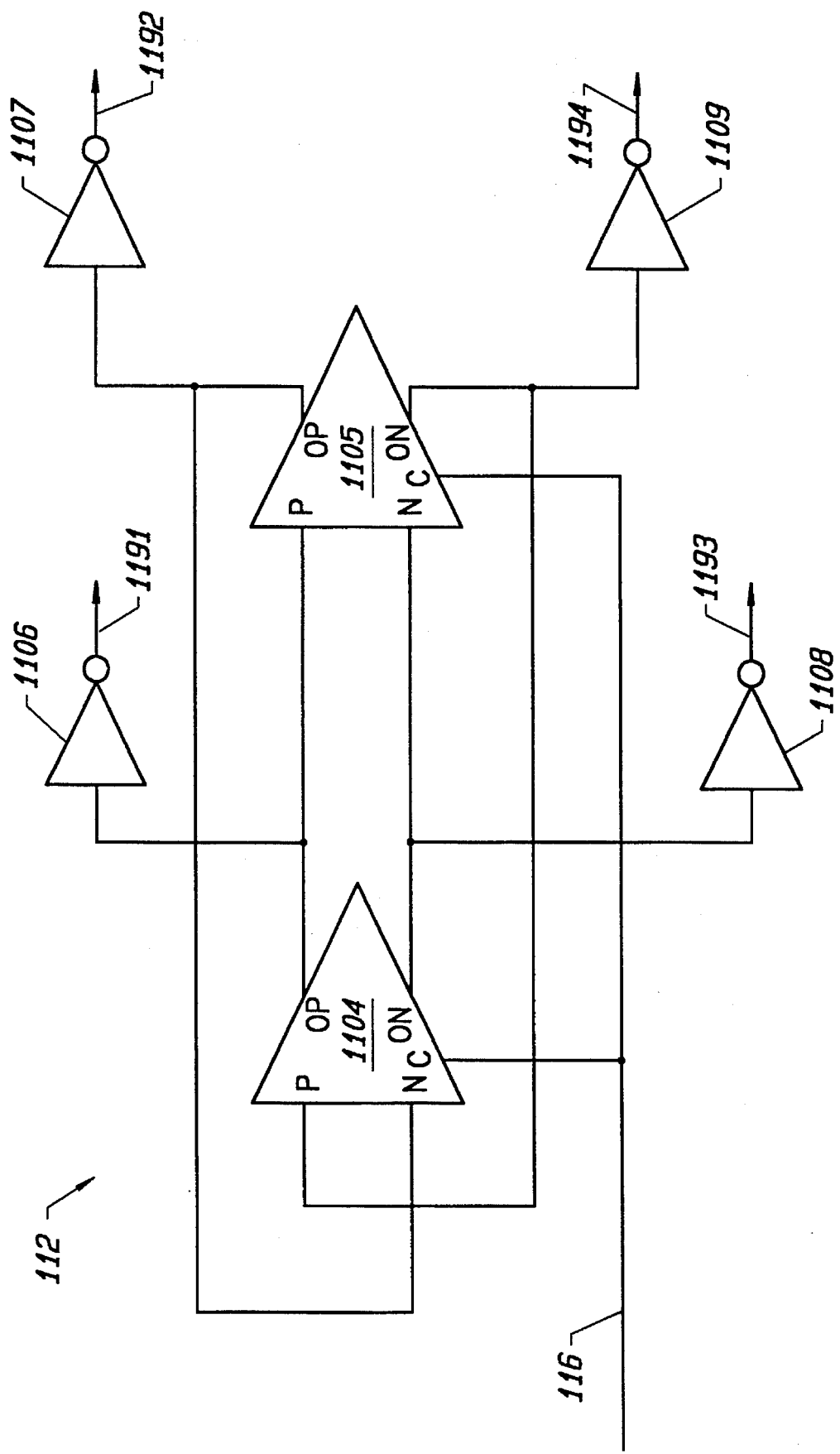
FIG. 7 shows the voltage-controlled oscillator in the phase-locked loop of FIG. 2.

The VCO 112 is shown in FIG. 7, and can be seen to comprise two differential amplifiers 1104 and 1105 in a ring oscillator configuration. The differential amplifiers 1104, 1105 each have a P input and an N input and outputs OP and ON. The ON output is the inverse of the OP output. The OP output of differential amplifier 1104 is connected with the P input of differential amplifier 1105, and the ON output of differential amplifier 1104 is connected with the N input of differential amplifier 1105. The OP output of differential amplifier 1105 is connected with the N input of differential amplifier 1104, and the ON output of differential amplifier 1105 is connected with the P input of differential amplifier 1104.

Two of the outputs of the VCO, intermediate signals 1191 and 1192, are taken from the OP outputs of differential amplifiers 1104 and 1105 respectively, as inverted by invertors 1106 and 1107. The remaining two outputs of the VCO, intermediate signals 1193 and 1194, are taken from the ON outputs of the differential amplifiers 1104 and 1105, respectively, as inverted by invertors 1108 and 1109. As in the preliminary PLL's VCO 307, the configuration results in oscillation of the intermediate signals 1191–1194 (collectively, 1190), controlled by the voltage of signal 116, where the difference in the phases of the four intermediate signals 1191–1194 are equally distributed over 360°. Specifically, if intermediate signal 1191 is taken as the 0'th signal, then intermediate signals 1192, 1193 and 1194 are delayed by 90°, 180° and 270°, respectively.

As was the case with the preliminary PLL's VCO, with appropriate modification of circuitry, the VCO 112 may be formed using either an odd or an even number of amplifiers.

E. Frequency Divider

Figure 8:
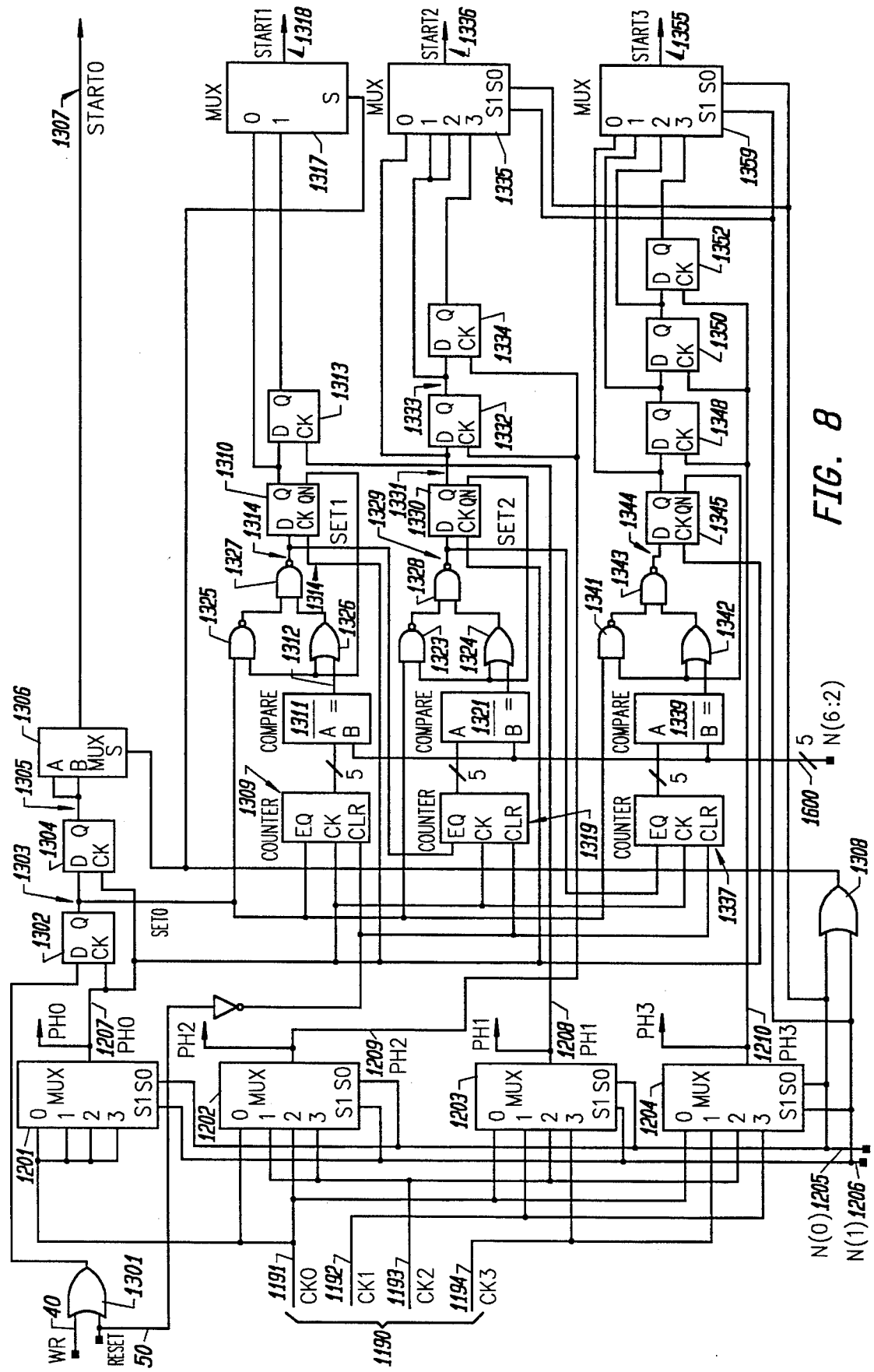
FIGS. 8 and 9 together show the circuitry of the feedback frequency divider of FIG. 2.
Figure 9:
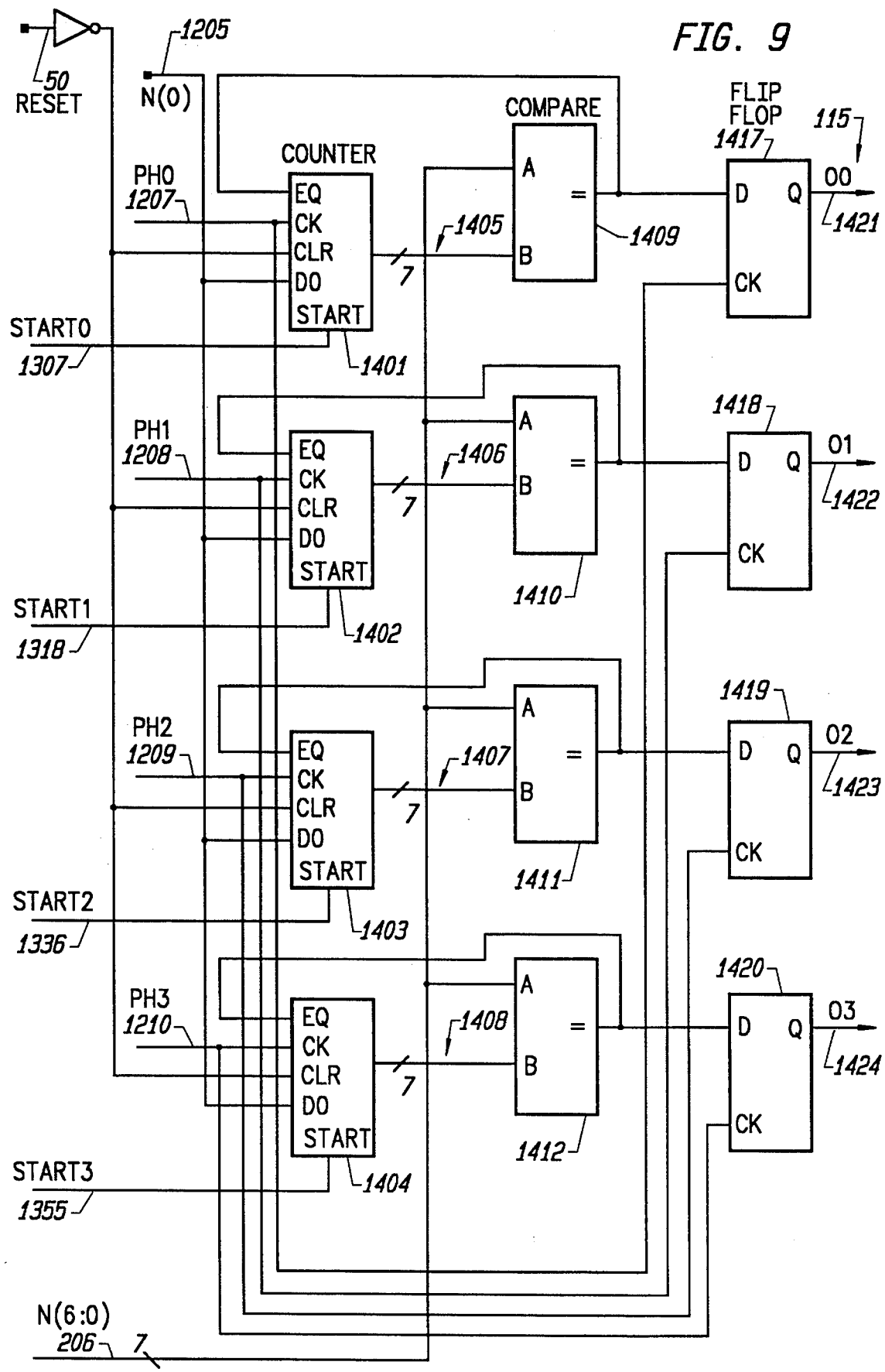

FIGS. 8 and 9 show the feedback frequency divider 109. It comprises a starting portion shown in FIG. 8, followed by the steady state counting portion shown in FIG. 9. The starting portion produces four signals START0, START1, START2 and START3, which indicate to four parallel counters in FIG. 9 when to start counting. Thus the START signals effectively delay the count cycles of the four counters by different delay periods.

The complexity of the feedback frequency divider circuitry 109 is due mainly to the fact that the feedback divisor, N, is programmable to any integer between 1 and 127, inclusive. It will be appreciated that the circuitry can be simplified if N is restricted to only even numbers. It can be simplified further if N is restricted to only multiples of 4, and can be simplified most if N is fixed in a particular embodiment.

Referring to FIG. 8, N(6:2) is provided from a programmable register (not shown) over lines 1600. (As used herein, N(B:A) is shorthand for "bits B through A of N.") N(1) is carried on line 1206, and N(0) is carried on line 1205.

N(1:0) are connected to the select inputs of four multiplexers 1201, 1202, 1203 and 1204, which select among the four intermediate signals 1191, 1192, 1193 and 1194 to produce four phase signals PH0 (1207), PH1 (1208), PH2 (1209) and PH3 (1210), according to the following function:

$$PH_m = CK(m \cdot \Delta) \text{ where } \Delta = N \bmod 4, \, m \in [0-3]$$

and as shown in the following table for N=8–11:

| N = 8 ($\Delta$ = 0) | N = 9 ($\Delta$ = 1) | N = 10 ($\Delta$ = 2) | N = 11 ($\Delta$ = 3) |
|---|---|---|---|
| PH0 = CK0 | PH0 = CK0 | PH0 = CK0 | PH0 = CK0 |
| PH1 = CK0 | PH1 = CK1 | PH1 = CK2 | PH1 = CK3 |
| PH2 = CK0 | PH2 = CK2 | PH2 = CK0 | PH2 = CK2 |
| PH3 = CK0 | PH3 = CK3 | PH3 = CK2 | PK3 = CK1 |

More generally, for M phases, the signals are selected as follows:

$$PH_m = CK(m \cdot \Delta) \bmod M \quad m \in [0, M-1]$$

where $\Delta = N \bmod M$

Figure 10:
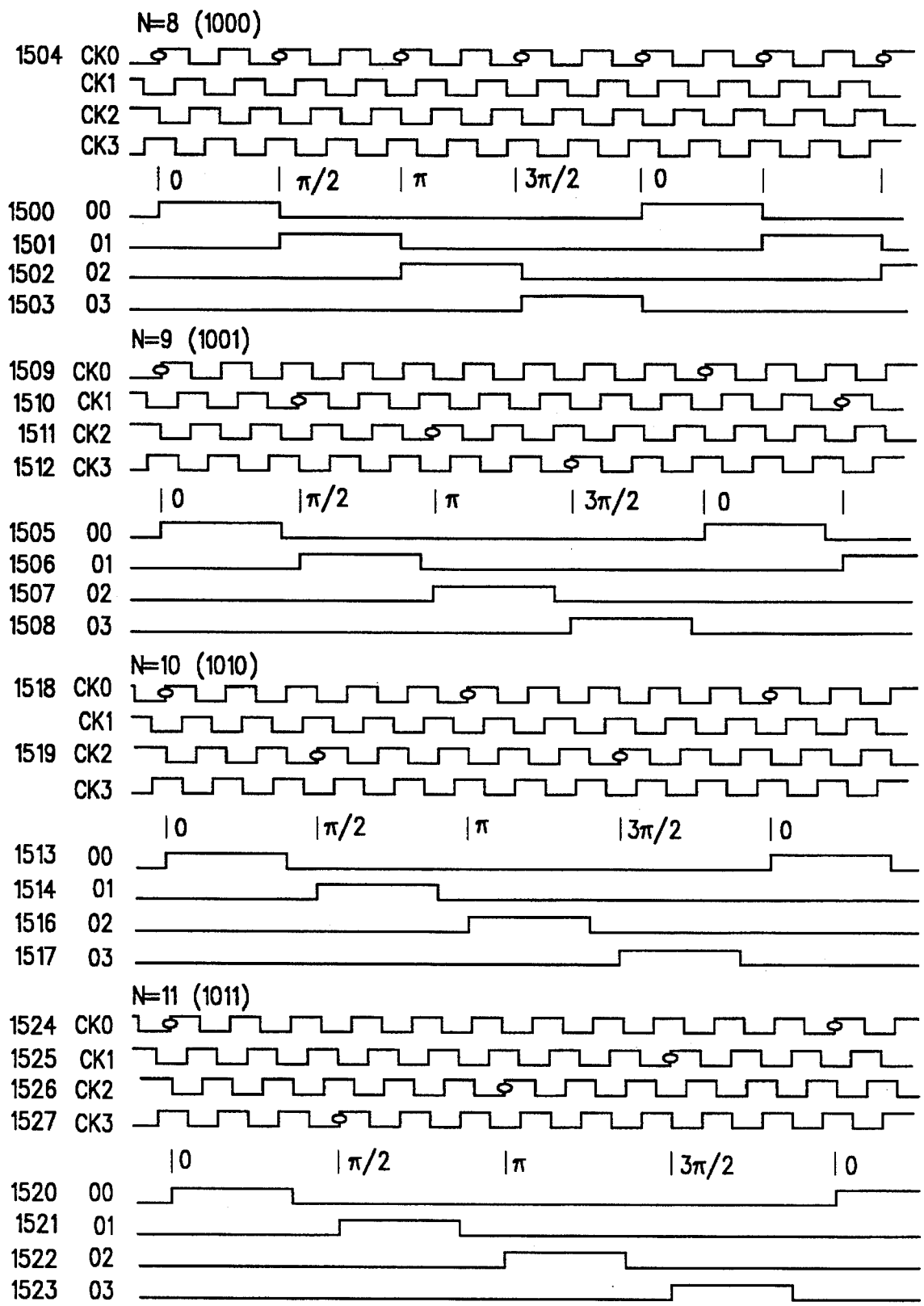
FIG. 10 shows timing diagrams for embodiments of the improved phase-locked loop of FIG. 2.

The purpose of the multiplexers 1201–1204 will become evident by examining the timing diagrams in FIG. 10. The objective is to create 4 feedback signals O0, O1, O2 and O3 that are 90 degrees out-of-phase from each other, and are equally distributed over N output signal cycles, for use by the phase detectors 106. This requires starting delays of N/4 cycles of the VCO output signal 113. For N=8, the delays are simply two cycles each. However, for N=9, the delay must be 2¼ output cycles each; the delay for N=10 must be 2½ cycles each, and the delay for N=11 must be 2-¾ cycles each. The start circuitry of FIG. 8 uses N(6:2) to perform the integer portion of these delays, and then uses N(1:0) to select one of the incoming phases CK0-3 carried on the intermediate signal lines 1191–1194 to perform the fractional part of the delay. The four parallel counters in FIG. 9 are then clocked based on the selected phases.

Thus, for N=8, the 4 output phases O0, O1, O2 and O3 1500–1503 are derived from every other clock of the intermediate signal CK0 1504. The associated rising edges of CKO used in this derivation are circled in the timing diagram of FIG. 10. For N=9, the phases of the output signals O0, O1, O2 and O3 1505–1508 are derived from phases of the intermediate signals CK0, CK1, CK2 and CK3 1509–1512, respectively. The associated rising edges of the intermediate signals are circled in FIG. 10. For N=10, O0 1513 is derived from CKO 1518, O1 1514 is derived from CK2 1519, O2 1516 is derived from CKO 1518, and O3 1517 is derived from CK2 1519. For N=11, O0 1520 is derived from CK0 1524, O1 1521 is derived from CK3 1527, O2 1522 is derived from CK2 1526, and O3 1523 is derived from CK1 1525.

The generation of the Start0–Start3 signals 1307, 1318, 1336, 1355 will now be described with reference to FIG. 8. A new set of Start signals 1307, 1318, 1336, 1355 is initiated by assertion of either the WR signal 40 (which is asserted each time N is changed) or the reset signal 50. The WR signal 40 and reset signal 50 are the inputs of an OR gate 1301, the output of which is the input to a D flip-flop 1302. The D flip-flop 1302 is clocked by PH0 1207. The output of the D flip-flop 1302 is identified as the Set 0 signal 1303. The Set 0 signal 1303 is the input to a second D flip-flop 1304 which is also clocked by PH0 1307. The output of the D flip-flop 1305 is connected to both input lines of a multiplexer 1306. The select line of the multiplexer 1306 is the output of an OR gate 1308 the inputs to which are N(1:0) carried on lines 1205, 1206. The output of the multiplexer 1306 is the Start 0 signal 1307. From the time reset 50 or WR 40 signal is triggered, two rising edges cycles of PH0 1207 will occur before the Start 0 signal 1307 goes active.

The Set 0 signal 1303 is also an input to the stage for generating the Start 1 signal 1318. The Set 0 signal 1303 is connected to the EQ input of a counter 1309 which allows the counter to continue to count but resets the 5-bit output of the counter 1309 to 0. The counter 1309 is clocked by PH0 1207. The count output of the counter 1309 is the input to a comparator 1311. The other input to the comparator 1311 are the five high-order bits of N, N(6:2) on lines 1600. The comparator produces an equality output 1312 after a number of clock cycles determined by N(6:2).

The equality output 1312 of comparator 1311 is connected to one input of an OR gate 1326, the other input of which is connected to the QN output of a D flip-flop 1310. The output of OR gate 1326 is connected to one input of a NAND gate 1327, the other input of which is connected to the D input of flip-flop 1310. The other input of NAND gate 1327 is connected to the output of a NAND gate 1325, one input of which is connected to receive the QN output of D flip-flop 1310, and the other input of which is connected to receive the SET 0 signal 1303. The flip-flop 1310 is clocked by PH0 so it will be seen that the gates 1325, 1326 and 1327, together with the flip-flop 1310, act to latch and hold the first assertion of the equality output of comparator 1311 after SET 0 has gone high.

The Q output of flip-flop 1310 is connected to the D input of another flip-flop 1313, which is clocked by PH 1 signal 1208. The Q outputs of flip-flops 1310 and 1313 are connected to A and B inputs of a multiplexer 1317, respectively, the select input of which is connected to the output of OR gate 1308 (which, as previously mentioned, ORs N (1) with N (0)). The output of multiplexer 1317 is the START 1 signal 1318. Thus, the rising edge of START 1 will be synchronous with PH0 for N mod 4=0, and will be synchronous with PH1 for N mod 4≠0. Multiplexer 1203 selects PH1 from CK0-3 according to N mod 4 as previously described, so it can be seen that flip-flops 1310 and 1313, in conjunction with multiplexer 1317, effectively delay the START 1 signal 1318 by N mod 4 fourths of the VCO output signal 113. That is, they delay START 1 by 0, ¼, ½, or ¾ of a cycle of the VCO output signal as appropriate.

Thus it can be seen that after SET 0 goes high, the integer portion of the delay required for START 1 is inserted by the counter 1309 and comparator 1311, whereas the fractional portion of the delay required for START 1 is inserted by flip-flops 1310 and 1313, and multiplexer 1317.

The START 2 signal 1336 is produced in a similar manner, with the integer portion of the delay being produced by a counter 1319 and comparator 1321 only after the integer portion of the delay for START 1 signal 1318 is complete. The START 1 circuitry indicates this by asserting a SET 1 signal from the output of NAND gate 1327 to the EQ input of counter 1319. Counter 1319 is clocked by the PH0 signal, and its 5-bit output is connected to one input port of comparator 1321. The other input port of comparator 1321 is connected to receive N(6:2), and its equality output is connected to one input of an OR gate 1324. The other input of OR gate 1324 is connected to the QN output of a D flip-flop 1330, and to the output of OR gate 1324 is connected to one input of a NAND gate 1328. The other input of NAND gate 1328 is connected to the output of another NAND gate 1323, one input of which is connected to receive the QN output of flip-flop 1330, and the other input of which receives SET 0. The output of NAND gate 1328 is connected to the D input of flip-flop 1330, and also provides an SET 2 signal to the EQ input of yet another counter 1337 which is used to produce the START 3 signal 1355. Counter 1337 is also clocked by PH0, and produces a 5-bit output which is provided to one input of a comparator 1339. The other input of comparator 1339 receives N(6:2), and its equality output is connected to one input of an OR gate 1342. The other input of OR gate 1342 is connected to receive the QN output of a D flip-flop 1345. The output of OR gate 1342 is connected to one input of a NAND gate 1343, the other input of which is connected to the output of a NAND gate 1341. The two inputs of NAND gate 1341 are connected to receive the QN output of flip-flop 1345, and SET 0. The output of NAND gate 1343 is a SET 3 signal, and is connected to the D input of flip-flop 1345. Both of the flip-flops 1330 and 1345 are clocked by PH0.

Thus it can be seen that the integer portion of the delays for START 1, START 2 and START 3 are counted in sequence with three counter/comparator pairs, each counting INT(N/4) cycles of PH0, and each starting only after the previous counter reaches its goal.

The Q output of flip-flop 1330 is connected to the D input of another D flip-flop 1332, the Q output of which is connected to the D input of yet another flip-flop 1334. The flip-flops 1332 and 1334 are clocked by PH2. The Q output of flip-flop 1330 is connected to the '0' input of a multiplexer 1335, and the Q output of flip-flop 1332 is connected to both the '1' input and the '2' input of multiplexer 1335. The Q output of flip-flop 1334 is connected to the '3' input of multiplexer 1335. The select inputs S(1:0) of multiplexer 1335 are connected to receive N(1:0). It will be appreciated that since flip-flops 1332 and 1334 are clocked by PH2, which itself results from a selection of CK0–CK3 based on N(1:0), the combination of flip-flops 1332 and 1334, and multiplexer 1335, insert a delay of 0, ½, 1 or 1½ cycles of the VCO output signal 113, depending on N(1:0) as appropriate.

For START 3, the Q output of flip-flop 1345 is connected to the D input of another flip-flop 1348, the Q output of which is connected to the D input of another flip-flop 1350. The Q output of flip-flop 1350 is connected to the D input of flip-flop 1352. The Q outputs of flip-flops 1345, 1348, 1350 and 1352 are all connected to respective 0, 1, 2 and 3 input ports of a multiplexer 1359. The select inputs S(1:0) of multiplexer 1359 are connected to receive N(1:0). Like the START 1 and START 2 signals, since the clock inputs of flip-flops 1348, 1350 and 1352 are all connected to receive PH3 which itself is selected based on N(1:0), the flip-flops 1348, 1350 and 1352 in combination with multiplexer 1359 effectively insert a delay of 0, ¾, 1½ or 2¼ cycles of the VCO output signal 113, as appropriate.

The generation of the feedback signals O0–O3, 1421, 1422, 1423, 1424 (collectively 115), will now be described with reference to FIG. 9. This final output stage of the feedback frequency divider 109 consists of four identical parallel stages, one for each of the feedback signals 1421, 1422, 1423, 1424. Each stage includes a counter 1401, 1402, 1403 or 1404, a comparator 1409, 1410, 1411 or 1412, and a D flip-flop 1417, 1418, 1419 or 1420. These stages differ only in their inputs.

Each of the counters 1401, 1402, 1403 and 1404 has a START input which is connected to receive the respective START 0, START 1, START 2 and START 3 signals from FIG. 8. Thus the counters will not begin counting until after the proper delay has already been inserted by the START circuitry of FIG. 8. These counters are also clocked by PH0, PH1, PH2 and PH3, respectively, so that whichever of them are started out of phase with the VCO output signal 113, the same out-of-phase relationship will continue through all subsequent counts. The 7-bit count outputs of the counters 1401, 1402, 1403 and 1404 are each connected to the B input ports of respective comparators 1409, 1410, 1411 and 1412, the A inputs of which are connected to receive N(6:0). The equality outputs of these comparators are connected back to the EQ inputs of the respective counters 1401, 1402, 1403 and 1404 where they are used to reset the counter to 0 without stopping the counter. Thus it can be seen that the counter/comparator pair in each of the four parallel stages in FIG. 9 all divide their respective clock input signals by N. Note that N(0) is provided to the counters 1401, 1402, 1403 and 1404 as well as being provided to the comparators 1409, 1410, 1411 and 1412. This is because if N(0)=0, the counters pre-divide the clock frequency by two in order to reduce the speed demands on the counters at high frequencies.

The equality outputs of comparators 1409, 1410, 1411 and 1412 are connected to the D inputs of respective flip-flops 1417, 1418, 1419 and 1420, which are clocked respectively by PH0, PH1, PH2 and PH3. These flip-flops serve to resynchronize the counter outputs with the correct intermediate signal 1190. The Q outputs of flip-flops 1417, 1418, 1419 and 1420 form the feedback signal outputs 1421, 1422, 1423 and 1424, respectively, of the feedback frequency divider 109.

While the invention has been described in connection with specific embodiments, the invention is capable of further modification, and this application is intended to cover any variations, uses, or adaptations of the invention following, in general, the principles of the invention and including such departures from the present disclosure as come within known or customary practice in the art to which the invention pertains and as may be applied to the essential features, and as fall within the scope of the invention and the limits of the appended claims.

We claim:

1. Phase-locked loop apparatus for producing an output signal having an output signal frequency, in response to an input signal oscillating at an input signal frequency, each cycle of said input signal being divided into a plurality of phase intervals, comprising:

error means for producing an output frequency control signal in response to a number of comparisons between a feedback signal frequency and said input signal frequency, said comparisons occurring with respect to each of said plurality of phase intervals within each cycle of said input signal;

output means for producing said output signal in response to said output frequency control signal; and feedback means for producing a feedback signal in response to said output frequency control signal, said feedback signal having said feedback signal frequency, each cycle of said feedback signal being divided into a plurality of phase intervals and said feedback signal frequency being a non-integer multiple of the number of said comparisons.

2. Apparatus according to claim 1, wherein said output signal frequency is higher than said input signal frequency.

3. Apparatus according to claim 1, wherein said output frequency control signal is a voltage signal, and wherein said output means comprises a voltage-controlled oscillator.

4. Apparatus according to claim 1, wherein said error means comprises reference edge means, responsive to said input signal, for generating a reference edge transition for each phase interval in each cycle of said input signal, wherein said feedback means comprises feedback edge means, responsive to said output frequency control signal, for generating a plurality of feedback edge transitions each corresponding to a respective one of said reference edge transitions, and wherein said error means further comprises comparison means for adjusting said output frequency control signal in response to time differences between each of said feedback edge transitions and its corresponding reference edge transition.

5. Apparatus according to claim 4, wherein said reference edge means generates alternating rising and falling edge transitions for each phase interval in each cycle of said input signal, and wherein said reference edge transitions include only said rising edge transitions.

6. Apparatus according to claim 4, wherein said plurality of phase intervals in each cycle of said input signal constitutes M of said phase intervals, and wherein said reference edge means comprises means for generating M reference signals, each corresponding to a respective one of said phase intervals of said input signal, each having a copy of said input signal, and each i'th one of said reference signals being delayed, relative to a 0'th one of said reference signals, by i/M cycles of said input signal, 0<i<M.

7. Apparatus according to claim 6, for use in producing said output signal with an output signal frequency of N times said input signal frequency, N>1, wherein said feedback edge means comprises means, responsive to said output frequency control signal, for generating M feedback signals, each corresponding to a respective one of said phase intervals of said input signal, each having one of said feedback edge transitions occurring at a frequency of 1/N times said output signal frequency, and each j'th one of said feedback signals being delayed, relative to a 0'th one of said reference signals, by (j/M)·N cycles of said output signal, 0<j<M.

8. Apparatus according to claim 7, wherein said comparison means comprises:

M phase detectors each coupled to receive a respective one of said reference signals and a corresponding one of said feedback signals, and to generate a respective comparison signal indicating a time difference between occurrences of reference edge transitions in said respective reference signal and feedback edge transitions in said corresponding feedback signal; and adjustment means for adjusting said output frequency control signal in response to all of said comparison signals.

9. Apparatus according to claim 4, for use in producing said output signal with an output signal frequency of N times said input signal frequency, N>1, wherein said feedback edge means comprises means, responsive to said output frequency control signal, for generating M feedback signals, each corresponding to a respective one of said phase intervals of said input signal, each having one of said feedback edge transitions occurring at a frequency of 1/N times said output signal frequency, and each j'th one of said feedback signals being delayed, relative to a 0'th one of said reference signals, by (j/M)·N cycles of said output signal, 0<j<M.

10. Apparatus according to claim 1, for use further with a predecessor signal oscillating at a predecessor signal frequency of D times said input signal frequency, further comprising a divide-by-D frequency divider having an input coupled to receive said predecessor signal and an output coupled to provide said input signal.

11. Apparatus according to claim 1, wherein said non-integer multiple is programmable.

12. Phase-locked loop apparatus for producing an output signal having an output signal frequency, in response to an input signal oscillating at an input signal frequency, each cycle of said input signal being divided into a plurality of phase intervals, comprising:

preliminary circuitry having an input coupled to receive said input signal and further having M outputs, M>1, said preliminary circuitry producing a respective reference signal on each of said outputs, each of said reference signals being a delayed version of said input signal and each i'th one of said reference signals being delayed by a respective i'th different delay time relative to a 0'th one of said reference signals, 0<i<M, all of said delay times being positive but shorter than one period of said input signal frequency;

M phase detectors, each having a reference input, a feedback input and an output, the reference input of each of said phase detectors being coupled to receive a respective one of said reference signals and the feedback input of each of said phase detectors being coupled to receive a respective one of M feedback signals;

output frequency control circuitry having M inputs each coupled to the output of a respective one of said phase detectors, said output frequency control circuitry further having an output;

a controlled oscillator having a control input coupled to the output of said output frequency control circuitry and further having an output carrying said output signal of said phase-locked loop apparatus; and feedback circuitry, responsive to the output of said output frequency control circuitry, having M outputs each carrying a respective one of said feedback signals, each of said respective feedback signals having a frequency of (1/N) times said output signal frequency, where N is programmable, and each of said feedback signals being delayed by a respective j'th different delay time relative to a 0'th one of said feedback signals, 0<j<M, all of said delay times being positive but shorter than N times one period of said output signal frequency.

13. Apparatus according to claim 12, wherein said preliminary circuitry comprises a preliminary phase-locked loop.

14. Apparatus according to claim 12, for use in producing said output signal with an output signal frequency of N times said input signal frequency, wherein the i'th different delay time for each i'th one of said reference signals is (i/M) times the period of said input signal frequency and wherein said feedback circuitry generates each j'th one of said feedback signals to be so delayed as to start each new cycle (j/M)·N output signal cycles later than a 0'th one of said feedback signals, 0<j<M.

15. Apparatus according to claim 12, for use in producing said output signal with an output signal frequency of N times said input signal frequency, wherein the i'th different delay time for each i'th one of said reference signals is (i/M) times the period of said input signal frequency, and wherein said feedback circuitry comprises:

M divide-by-N frequency dividers each having an input coupled to receive a respective intermediate signal oscillating with a frequency responsive to said output of said output frequency control circuitry, and further having an output carrying a respective one of said feedback signals; and (M−1) delay elements, each j'th delay element including means for preventing a corresponding j'th one of said frequency dividers from starting for (j/M)·N cycles of one of said intermediate signals, relative to a start time of a 0'th one of said frequency dividers, 0<j<M.

16. Apparatus according to claim 12, wherein N is programmable to a value within a predetermined set of values including at least one non-integer multiple of M.

17. An improved phase-locked loop, comprising:

a preliminary phase-locked loop having an input connected to an input signal source, the preliminary phase-locked loop having M outputs, where M is a number greater than one;

a number M of phase detectors, each having a first input connected to a respective one of the outputs of the preliminary phase-locked loop, said phase detectors each further having a second input and an output;

a number M of charge pumps, each having an input connected to the output of a respective one of the phase detectors;

a low-pass filter having an input port connected to the outputs of all of the phase detectors, said filter further having an output;

a voltage-controlled oscillator having a control input connected to the output of the low-pass filter, wherein the voltage-controlled oscillator has at least one output;

a divide-by-N feedback frequency divider, having an input port connected to the at least one output of the voltage-controlled oscillator, and having M outputs, each output of the feedback frequency divider being connected to the second input of a respective one of the phase detectors, N being a non-integer multiple of M.

18. An improved phase-locked loop in accordance with claim 17, wherein the outputs of the charge pumps are connected to the input of the low-pass filter through a current summer.

19. An improved phase-locked loop in accordance with claim 17, wherein the at least one output of the voltage-controlled oscillator comprises M outputs, all of which are connected to the feedback frequency divider via the input port of the feedback frequency divider.

20. An improved phase-locked loop in accordance with claim 15, wherein N is programmable.

21. A method for generating a system output signal having an output frequency and a phase, in response to an input signal having a phase and an input frequency, the system output signal having an output frequency of a predetermined number N times said input frequency, said method comprising the steps of:

producing a plurality of reference signals responsive to said input signal, each having a different respective phase relative to that of the input signal and a respective frequency related to the input frequency;

producing a plurality of feedback signals, each of said feedback signals having a different respective phase relative to that of the output signal and a feedback frequency having a relation to the output frequency, each of said feedback signals corresponding to a respective one of said reference signals;

programming said relation of said feedback frequency to said output frequency;

producing a plurality of error signals, each responsive to the difference between the phase of a respective one of the reference signals and that of its corresponding feedback signal; and adjusting the frequency of the system output signal in response to at least two of the plurality of error signals.

22. A method according to claim 21, further comprising the steps of:

producing a plurality of intermediate signals, said intermediate signals each having a different respective phase relative to that of the output signal and a frequency equal to the output frequency;

selecting a respective one of the intermediate signals to correspond with each of the feedback signals;

dividing the frequency of each of the selected intermediate signals by N to produce its corresponding feedback signal.

23. A method according to claim 21, wherein said step of programming said relation of said feedback frequency to said output frequency includes programming said feedback frequency to be (1/N) times said output frequency, where N is a non-integer multiple of the number of feedback signals in said plurality of feedback signals.

24. An improved phase-locked loop, for use with an input signal having a frequency and a phase, comprising:

a preliminary phase-locked loop which accepts the input signal and produces four reference signals, each reference signal having a common frequency related to the frequency of the input signal, first, second and third ones of the reference signals further having phases of 90°, 180° and 270°, respectively, relative to a 0'th one of the reference signals;

four phase detectors, each associated with a respective one of the reference signals and with a respective one of four feedback signals, each of said four feedback signals having a frequency and a phase, the frequencies of the feedback signals being equal and the phases of first, second and third ones of the feedback signals being 90°, 180° and 270°, respectively, from the phase of a 0'th one of the feedback signals, each phase detector accepting its associated reference signal and feedback signal and producing a respective error signal in response to the difference between the phase of its associated reference signal and its associated feedback signal;

four charge pumps, each of said four charge pumps accepting one of said error signals produced by one of the four phase detectors and producing a respective current output, the outputs of said four charge pumps being current-summed to produce a system error signal;

a voltage-controlled oscillator, connected to receive system error signal, said voltage-controlled oscillator producing an output signal and four intermediate signals, each of the output signals and four intermediate signals having a frequency and a phase, the frequencies of the output signal and all four intermediate signals being equal and the phase of first, second and third ones of the intermediate signals being 90°, 180° and 270°, respectively, from the phase of a 0'th one of the intermediate signals, the frequency of the four intermediate signals being determined in response to the system error signal; and a divide-by-N frequency divider, accepting the four intermediate signals and producing said feedback signals, the frequency and phase of the feedback signals being related to the frequency and phase of said intermediate signals, where N is a non-integer multiple of four.

25. An improved phase-locked loop in accordance with claim 20, wherein N is programmable.

26. Phase-locked loop apparatus for producing an output signal having an output signal frequency, in response to an input signal oscillating at an input signal frequency, each cycle of said input signal being divided into a plurality of phase intervals, comprising:

preliminary circuitry having an input coupled to receive said input signal and further having M outputs, M>1, said preliminary circuitry producing a respective reference signal on each of said outputs, each of said reference signals being a delayed version of said input signal and each i'th one of said reference signals being delayed by a respective i'th different delay time relative to a 0'th one of said reference signals, O<i<M, all of said delay times being positive but shorter than one period of said input signal frequency;

M phase detectors, each having a reference input, a feedback input and an output, the reference input of each of said phase detectors being coupled to receive a respective one of said reference signals and the feedback input of each of said phase detectors being coupled to receive a respective one of M feedback signals;

output frequency control circuitry having M inputs each coupled to the output of a respective one of said phase detectors, said output frequency control circuitry further having an output;

a controlled oscillator having a control input coupled to the output of said output frequency control circuitry and further having an output carrying said output signal of said phase-locked loop apparatus; and feedback circuitry, responsive to the output of said output frequency control circuitry, having M outputs each carrying a respective one of said feedback signals and comprising:

M divide-by-N frequency dividers each having an input coupled to receive a respective intermediate signal oscillating with a frequency responsive to said output of said output frequency control circuitry, and further having an output carrying a respective one of said feedback signals; and (M−1) delay elements, each j'th delay element including means for preventing a corresponding j'th one of said frequency dividers from starting for $(j/M) \cdot N$ cycles of one of said intermediate signals, relative to a start time of a 0'th one of said frequency dividers, $0 < j < M$.

* * * * *

UNITED STATES PATENT AND TRADEMARK OFFICE
CERTIFICATE OF CORRECTION

PATENT NO. : 5,550,515
DATED : August 27, 1996
INVENTOR(S) : Jui Liang, et al.

It is certified that error appears in the above-indentified patent and that said Letters Patent is hereby corrected as shown below:

Claim 20, Column 15, Line 9:
After "claim" and before "wherein"
delete "15" and substitute therefor
--17--.

Claim 25, Column 16, Line 30: After "claim" and before "wherein" delete "20" and substitute therefor --24--.

Signed and Sealed this

Seventh Day of January, 1997

Attest:

BRUCE LEHMAN

Attesting Officer

Commissioner of Patents and Trademarks